US008130502B2

(12) United States Patent
Fransen et al.

(10) Patent No.: US 8,130,502 B2
(45) Date of Patent: Mar. 6, 2012

(54) MODULAR STACKABLE ANGLED PATCH PANEL FOR ENCLOSURE

(75) Inventors: Robert E. Fransen, Homer Glen, IL (US); Jason O'Young, Oak Forest, IL (US); Jeremy S. Parrish, Mokena, IL (US); Edward G. Blomquist, Plainfield, IL (US)

(73) Assignee: Panduit Corp., Tinley Park, IL (US)

( * ) Notice: Subject to any disclaimer, the term of this patent is extended or adjusted under 35 U.S.C. 154(b) by 928 days.

(21) Appl. No.: 12/032,102

(22) Filed: Feb. 15, 2008

(65) Prior Publication Data

US 2009/0207577 A1 Aug. 20, 2009

(51) Int. Cl.
*H05K 7/00* (2006.01)

(52) U.S. Cl. ......................... 361/735; 361/807; 361/810

(58) Field of Classification Search .................. 361/735, 361/790, 301.4, 807, 810
See application file for complete search history.

(56) References Cited

U.S. PATENT DOCUMENTS 4,878,847 A * 11/1989 Rutledge ......................... 439/74
5,385,488 A * 1/1995 Clark ............................ 439/557
5,401,193 A * 3/1995 Lo Cicero et al. ............ 439/713
5,639,261 A * 6/1997 Rutkowski et al. ........... 439/534
5,893,763 A * 4/1999 O'Connor et al. ........... 439/76.1
5,945,633 A * 8/1999 Ott et al. ......................... 174/59
5,975,962 A * 11/1999 Laukonis ....................... 439/713
7,510,421 B2 * 3/2009 Fransen et al. ................ 439/449

OTHER PUBLICATIONS

Catalog, Leviton Voice Data, "Structured Media Panels & Boards", 2 pages.
Catalog, Suttle Soho, "Standard Patch Module", 1 page.
Catalog, Channel Vision Technology, "Wireless Home Networking Products", 1 page.

* cited by examiner

*Primary Examiner* — Hung S Bui
(74) *Attorney, Agent, or Firm* — Robert A. McCann; Zachary J. Smolinski; Christopher S. Clancy

(57) ABSTRACT

A modular patch panel module is mountable on an electronics enclosure and includes an angled patch face and mounting structure that enables stacking of modular patch panels without interference of patch panel cords with the top of the enclosure or another patch panel stacked thereon. The patch panel modules may each contain a plurality of RJ-45 ports and punchdown blocks. A cover plate may snap fit to the module to retain the patch panel electrical components therebetween.

11 Claims, 5 Drawing Sheets

MODULAR STACKABLE ANGLED PATCH PANEL FOR ENCLOSURE

FIELD OF INVENTION

The embodiments relate to a modular stackable patch panel mountable to an electronics enclosure or wall and, more particularly, to a patch panel having an angled patch cable mounting plane and mounting structure that enables stacking of the panels without interference with the top of the enclosure or another patch panel stacked thereon.

BACKGROUND

Buildings, in particular office, condominium or apartment buildings, which use various telecommunications systems, computer networks, or building operations systems, such as fire monitoring or surveillance systems, often rely on intricate patchworks of cables to interconnect the components within these systems and networks. Appropriate interconnection of cables locally within the building, for example an Ethernet, telephone, or building operational system are often centralized at one or more hubs, which allow installation, modification or removal of cable connections within these systems.

In many applications, such cabling is mounted on one or more patch panels on a building wall, rack or electrical enclosure, such as a wall mount cabinet, as a multi-dwelling unit/multi-tenant unit (MDU/MTU) solution to route high speed internet and other data voice communications lines to the various units through the hub. Such enclosures have various dimensions, but are often one or more standardized sizes, such as a 14", 19", or 23" wide enclosure of a given depth. Typically, various patch panels are mounted directly or indirectly, such as through a standoff, to a back wall of the enclosure in a single layer.

Although connections within such an enclosure are expandable by addition of extra patch panels to the back wall or enclosure, there has been a practical limit for expansion due to the fixed surface area of the back wall. Thus, when the surface area becomes filled, future expansion is not possible without the addition of extra cabinet enclosures.

Typical commercial mini patch panels for such applications have taken the form of flat units that mount directly or indirectly to the back wall of the cabinet enclosure.

SUMMARY

The exemplary embodiments relate generally to an improved patch panel module that allows for additional modular flexibility. More particularly, the patch panel modules may be stackable with other like patch panel modules to improve space efficiency and accommodate additional future growth. Additionally, in exemplary embodiments, the patch panel module has a patch cable mounting plane oriented at an angle relative to a module mounting plane so as to improve clearance for patch panel cabling. By having the cable mounting plane angled, patch panel cabling will not interfere with a stacked module. The angle also helps to satisfy patch cord bend radius requirements to allow sufficient bend radius for the cabling without interference with stacked modules. In one embodiment, the angle of the cable mounting plane is about 35°.

To simplify assembly and improve connection quality, vertical compliant pin ports such as RJ-45 ports, may be used, which do not require soldering but instead may be pressed into a printed circuit board for compliant connection. Alternatively, soldered RJ-45 ports may be used.

In accordance with additional embodiments, the patch panel module may be a mini patch panel module.

In yet further embodiments, the patch panel module may include two opposed C-shaped side walls, each defined by an upstanding wall and two perpendicular mounting walls. Each mounting wall extends along the mounting plane and includes mounting holes for receiving mounting fasteners.

In certain embodiments, the patch panel module may have a cover plate that retains electrical components of the patch panel securely fastened.

BRIEF DESCRIPTION OF THE DRAWINGS

Certain embodiments of the invention are illustrated by the accompanying figures. It should be understood that the figures are not necessarily to scale and that details that are not necessary for an understanding of the invention or that render other details difficult to perceive may be omitted. It should be understood, of course, that the invention is not necessarily limited to the particular embodiments illustrated herein.

DETAILED DESCRIPTION OF EMBODIMENTS

Figure 1:
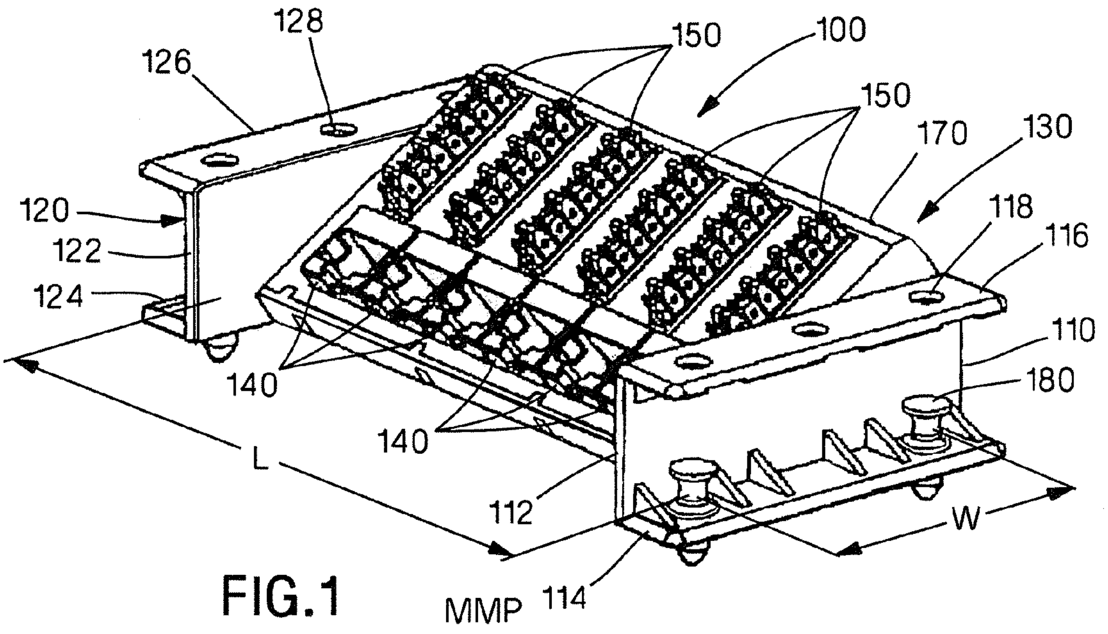
FIG. 1 is a front perspective view of an exemplary 6 port patch panel module according to an embodiment of the disclosure.

The embodiments relate to a patch panel module particularly suited for use in a wall-mounted telecommunications enclosure, but may be used outside of an enclosure. The patch panel module may be stackable with other like patch panel modules to improve space efficiency and accommodate additional future growth.

Referring to FIGS. 1-6, a patch panel module 100, such as the exemplary multiple port patch panel shown, includes a base formed of two C-shaped side walls 110, 120 and an angled base support panel 130 provided therebetween. Side wall 110 includes a main upstanding wall 112 and laterally extending mounting walls 114 and 116, each mounting wall having a series of mounting holes 118 for receiving fasteners 180 to mount the patch panel along a module mounting plane MMP. Similarly, side wall 120 includes a main upstanding wall 122 and laterally extending mounting walls 124 and 126, each mounting wall having a series of mounting holes 128 for receiving fasteners 180. The base may be formed from a lightweight plastic material, to reduce weight and cost, but also could be formed of metal. In an exemplary embodiment, side walls 110 and 120 and base support panel 130 are integrally molded as one piece from plastic. While the side walls 110 and 120 are illustrated as C-shaped, other profiles such as I-, L-, or T-shaped side walls may be employed.

The base may take various dimensions depending on the application and number of ports required. For example, the base has a length L of about 5" and a width W of about 2" as measured from the centerline of fasteners 180 and a height of about 1.375".

Figure 7:
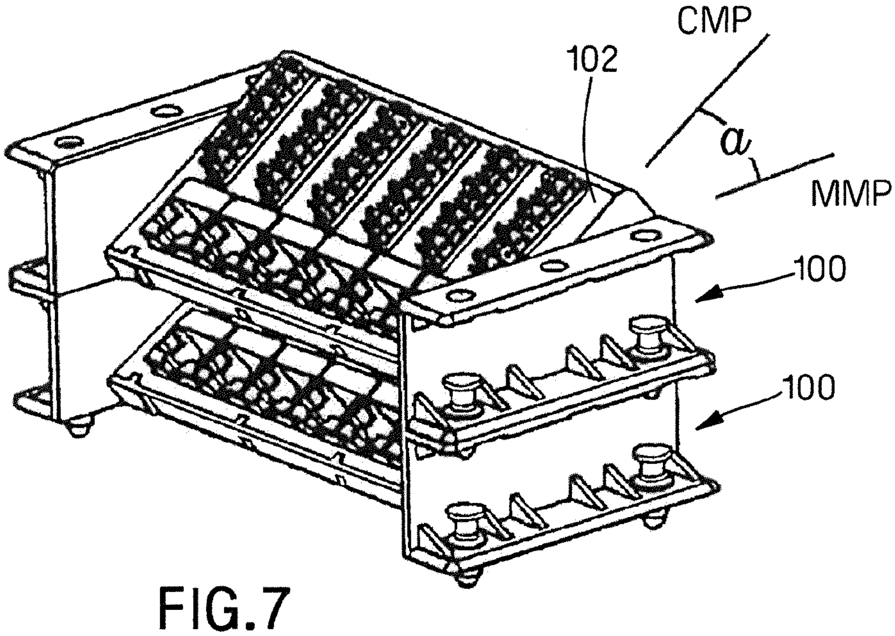
FIG. 7 is a front perspective view of two patch panel modules being stackably attached in accordance with an embodiment.

The base support panel 130 provides a mounting structure 132 (shown in FIG. 2) that mounts an electrical component assembly (discussed below) to form a cable mounting plane CMP (FIG. 7) oriented at an angle relative to the module mounting plane MMP so as to improve clearance for patch panel cabling. By having the front face angled, patch panel cabling will not interfere with a stacked module. The angle also helps to satisfy patch cord bend radius requirements. In certain embodiments, the angle is in a range between 15° and 60°. In other embodiments, angles outside this range could also be employed. In the embodiment of FIG. 7, the angle is about 35°. It is also possible to combine an angled front face with angled connectors to achieve a desired plug insertion angle. For example, the front face could be angled at 15° and a 45° angled jack could be used to give a total plug insertion angle of 60° if desired.

Figure 2:
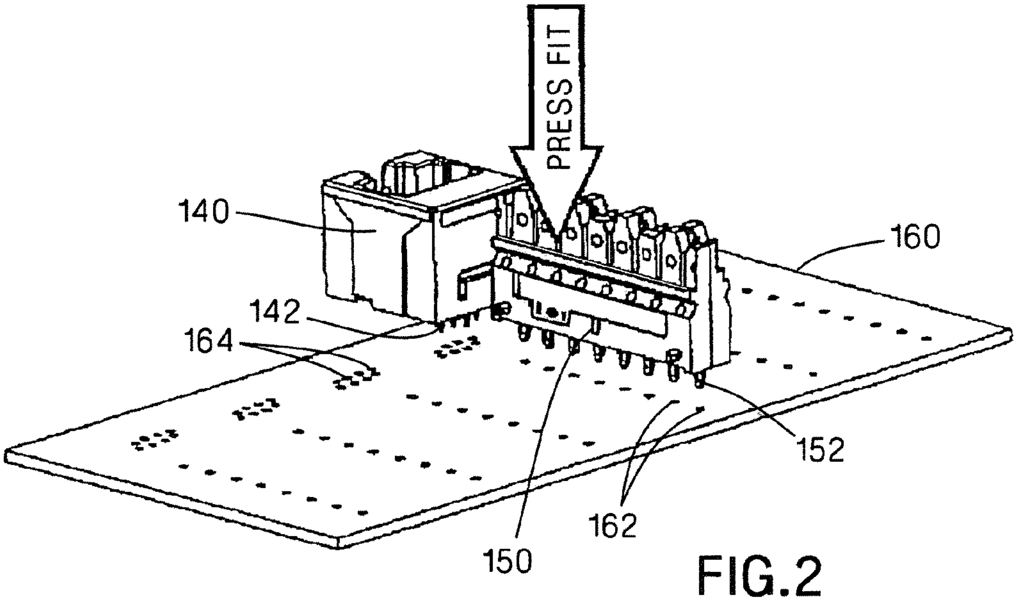
FIG. 2 is a perspective view of patch panel electrical components used to form the module.

As better shown in FIG. 2, a patch panel electrical component assembly can include a series of patch panel ports 140 for receiving patch cords that are electrically or optically coupled to a circuit board, such as, for example, a series of RJ-45 ports, and punchdown blocks 150 mounted on printed circuit board 160. In an embodiment, compliant components, such as press-fit components, may be used on the printed circuit board 160 to avoid the need for a secondary soldering process. As shown, pins 142 of each port 140 may be pressed into corresponding apertures 164 of printed circuit board 160 while pins 152 of each punchdown block 150 may be pressed into corresponding apertures 162 of printed circuit board 160 for compliant connection. Eliminating the soldering process reduces costs and improves quality by eliminating problems that can arise with poorly soldered circuit boards. Suitable ports, such as, for example, RJ-45 ports, are available from Panduit Corporation (P/N: PCM15E1PS-E). Suitable punchdown blocks are also available from Panduit Corporation (P/N: RP110PCB4CR), although the exemplary embodiments are not limited to these.

Although the exemplary embodiments are discussed with reference to compliant pins, or press fit pins, any attachment device now known or later developed that avoids the use of a secondary soldering process such as, for example, a vertical latch type pin, is also envisioned in connection with the exemplary embodiments. Embodiments of the present invention may also be used with soldered connectors.

Figure 3:
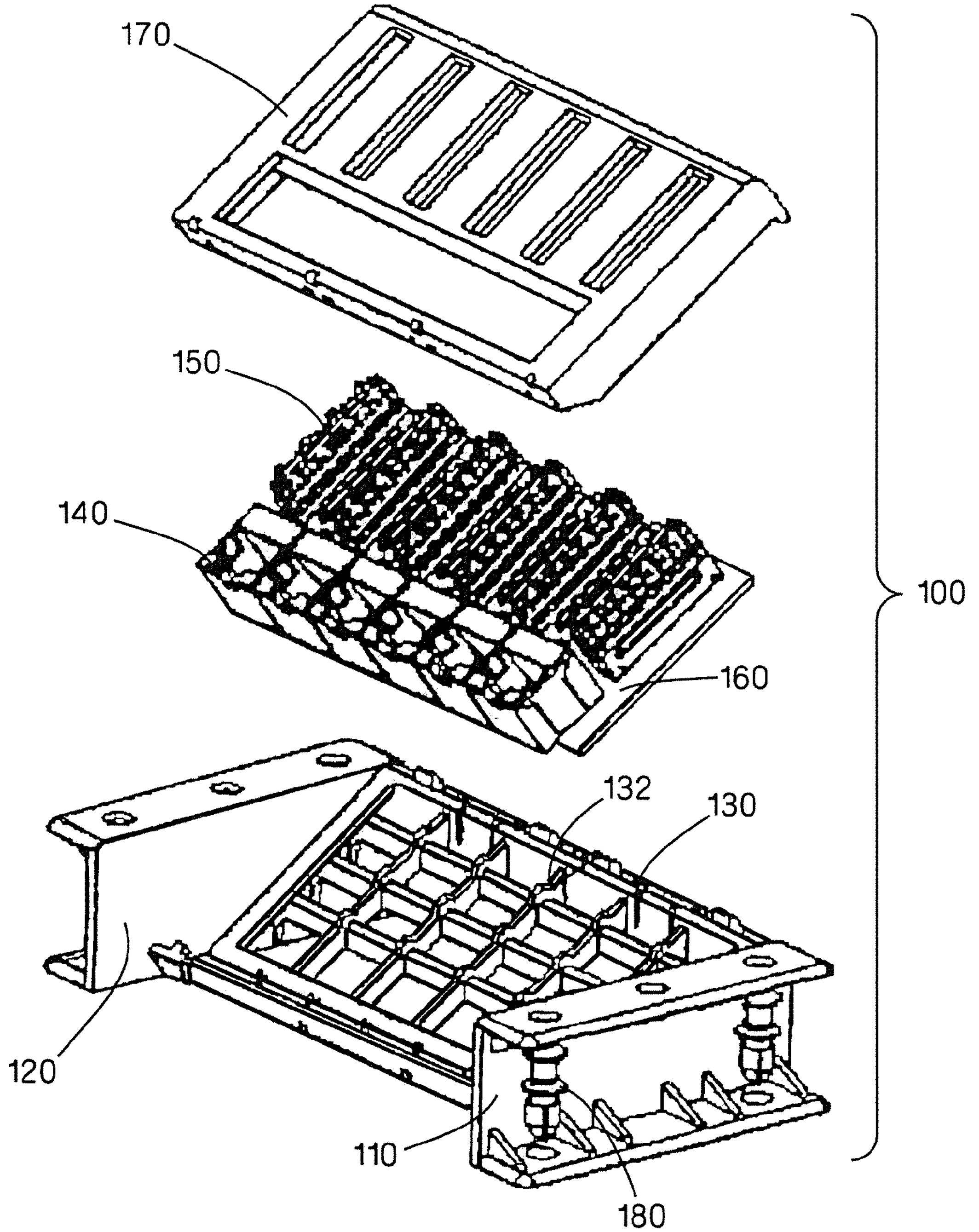
FIG. 3 is an exploded view of the patch panel module of FIG. 1 showing the base module, electrical components, and patch panel cover.

As shown in the exploded view of FIG. 3, the assembled electrical components 140, 150, 160 are mounted on an electrical component assembly mounting structure of base support panel 130 and held in place by suitable attachment, such as through a cover 170 fitted through a toe hold and latching system described below. To reduce the weight of the module, base support panel 130 may be formed of gridwork 132 or other support structure serving as the mounting structure.

Figure 4:
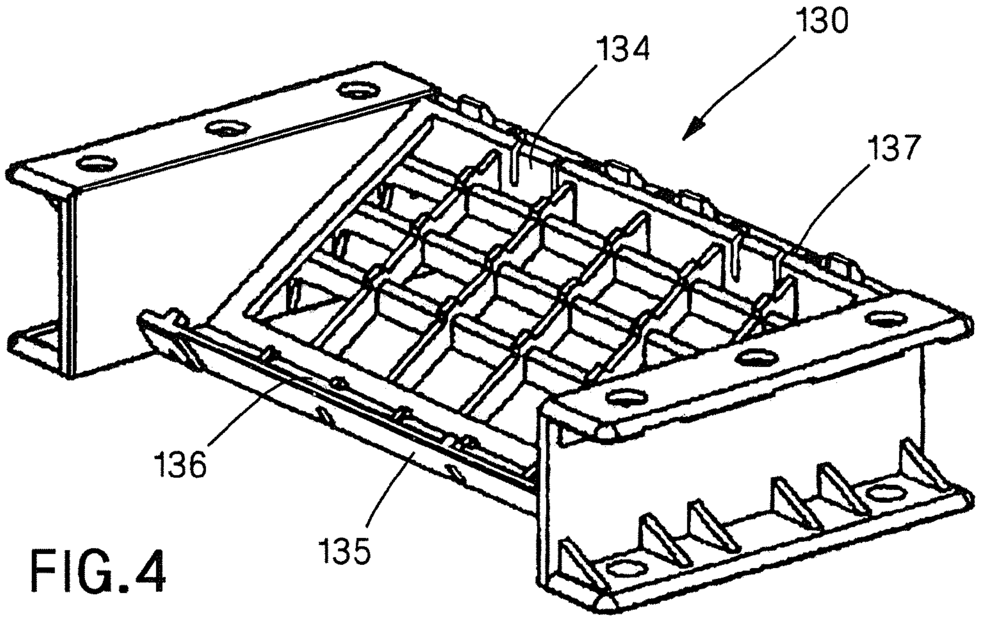
FIG. 4 is a front perspective view of the base module of the patch panel module of FIG. 1 showing toe and latch features for simple snap action connection of the cover.

The latching system will be described in more detail with reference to FIGS. 4, 5A and 5B. The toe holds and latching system between base 130 and cover 170 may be designed in a manner that obscures the latches from plain sight. In an exemplary embodiment, base 130 has a plurality of spaced apart toes 136 provided along one edge, such as a bottom edge 135 of base 130 as shown, and a plurality of spaced apart cantilever latches 134 provided along an opposite edge, such as a top edge 137 of base 130 as shown. In an embodiment, two snaps 134 and four toes 136 are provided. However, the embodiments are not limited to these and may deviate depending on the size and shape of the patch panel.

Figure 5A:
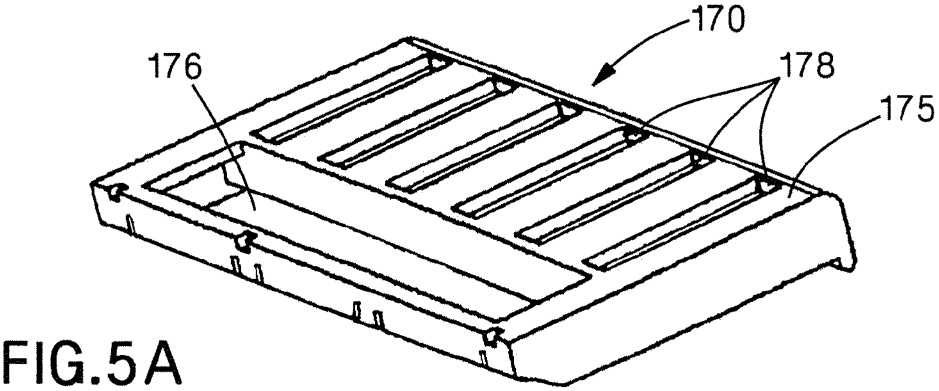
FIG. 5A is a top perspective view of the patch panel cover of FIG. 1.
Figure 5B:
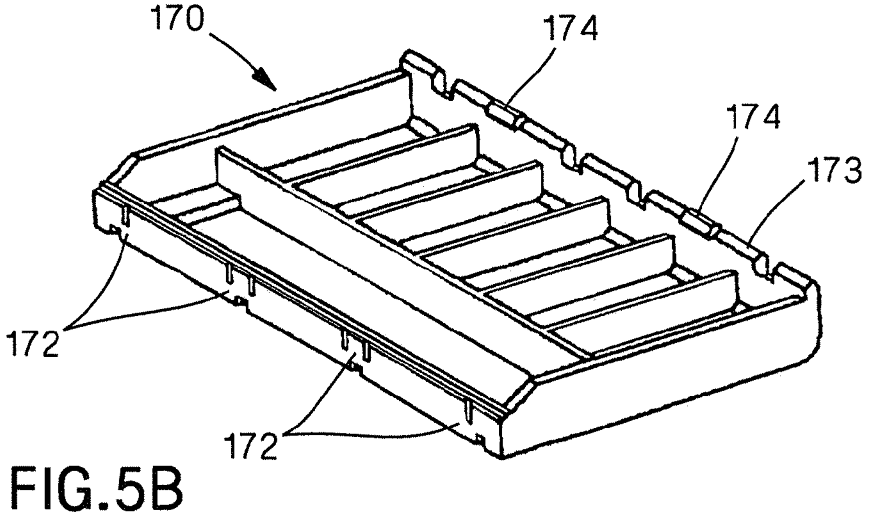
FIG. 5B is a bottom perspective view of the patch panel cover of FIG. 1.
Figure 6:
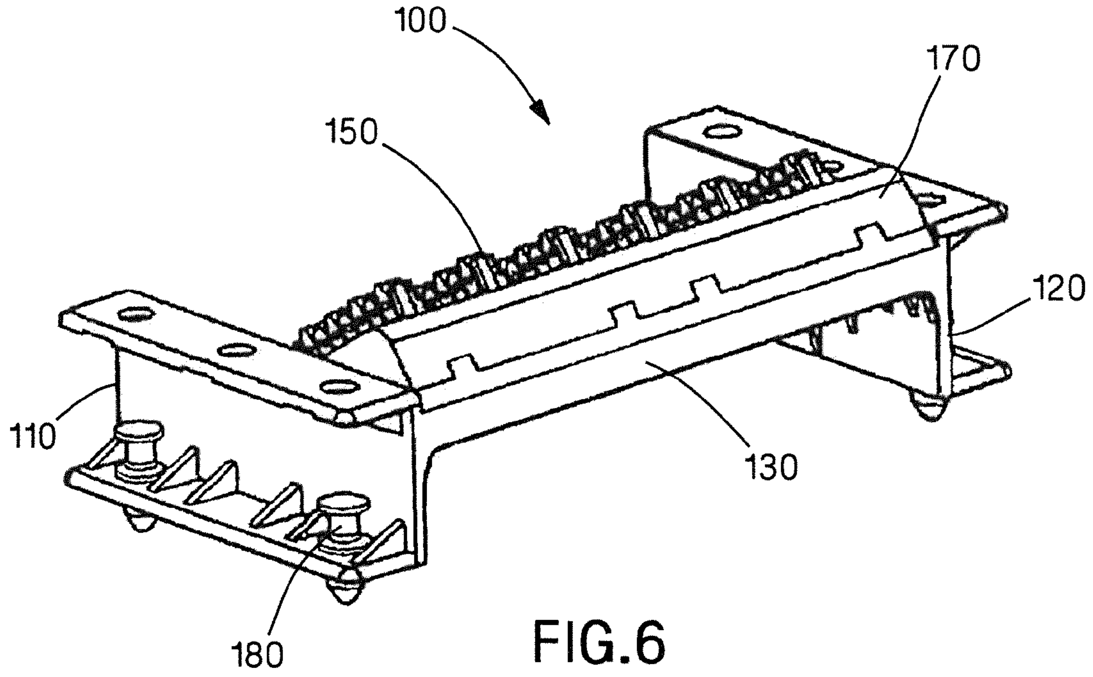
FIG. 6 is a rear perspective view of the patch panel module of FIG. 1.

As shown in FIGS. 5A and 5B, cover 170 has complementary toe holds 172 and latch ledges 174 on a back side 173 of cover 170 and apertures 176 and 178 on a front side 175 of cover 170. Toe holds 172 and latch ledges 174 keep the component base 130 and cover 170 firmly held together with the circuit board assembly 140, 150, 160 in between. Toe holds 172 retain the bottom of the cover on the base support member 130 by mating with toes 136 while latch ledges 174 are mated with cantilever snaps 134 to lock cover 170 to base support member 130. To assemble the patch panel, printed circuit board 160 with attached ports 140 and punchdown blocks 150 is placed inside the cover 170 so that the ports 140 and punchdown blocks 150 protrude through the corresponding apertures 176 and 178. Then, cover 170 is placed onto the base support panel 130 so that the toe holds 172 of cover 170 hook under toes 136 of base 130. Finally, cover 170 is rotated downward until snaps 134 mate with latch ledges 174 to secure the cover to the base. The end result is an assembly shown in FIGS. 1 and 6 with a clean outer appearance where the latching system is hidden from view. While a latching system is shown and described, other methods of joining the cover and base, such as screws or welds, may be employed in other embodiments.

Figure 8:
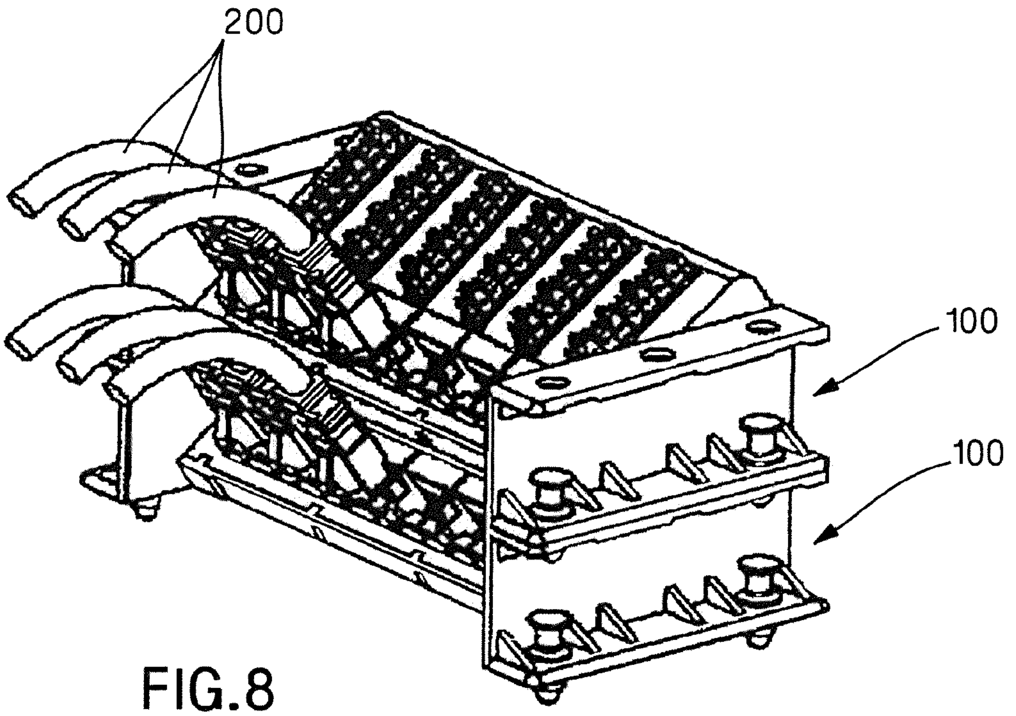
FIG. 8 is a front perspective view of the two stacked patch panel modules of FIG. 7 fitted with a plurality of patch panel cables.
Figure 9:
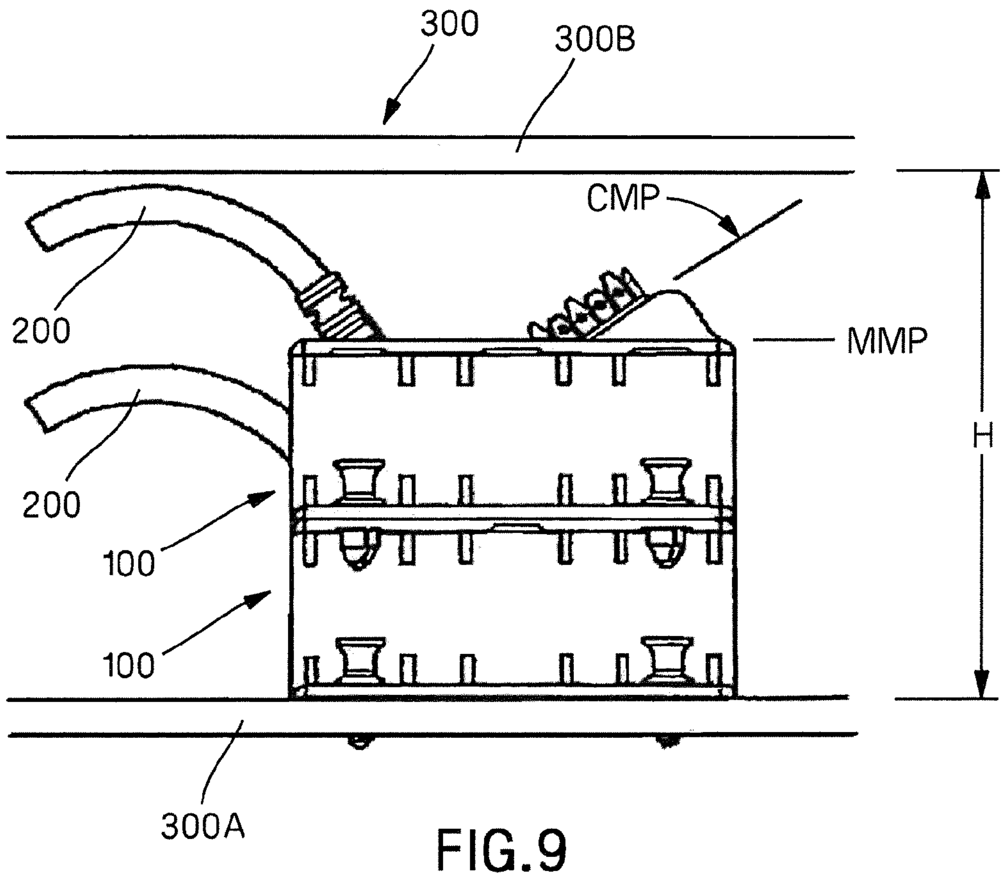
FIG. 9 is an internal side view of the stacked patch panel modules of FIG. 8 mounted within an electronic telecommunications cabinet enclosure.

As shown in FIGS. 7-9, patch panel modules 100 are able to be stacked on top of each other to accommodate future growth. This is particularly useful when the back wall of the enclosure has become populated and space is very limited. It is also very space efficient. Thus, if more patching ports are needed after an initial installation, another patch panel can be easily mounted atop an existing panel.

As discussed earlier, the patch panel module 100 contains electrical components (140-160) oriented to define a cable mounting plane CMP at an angle ($\alpha$) relative to the module mounting plane MMP, such as between about 15° and 60°, for example, about 35° as illustrated, so that patch cords 200 plugged into a lower module 100 can clear a top module or a front cover of an enclosure without interference (as shown in FIGS. 8-9). That is, rather than having a horizontally arranged cable mounting plane and near-vertical extending patch cords, the angled orientation reduces the necessary height for the assembly and cords, both when used alone and when stacked as a pair or set, and also helps satisfy patch cord bend radius requirements for Cat 5e, Cat 6 or 10 gig cables, for example, even when the modules are stacked. For example, it is often desirable to maintain a cable bend radius of 4× the cable diameter or greater. This is achieved by orienting the cable mounting plane CMP at an angle $\alpha$, which may be an acute angle, relative to the mounting plane and, when the patch panel modules are stacked, further achieved by an angular relationship and orientation that avoids interference with the stacked module or enclosure wall above the lowermost module. These features will be described in more detail below.

As shown in FIGS. 7-9, the fasteners can attach the module to a wall, such as the rear wall 300A of enclosure 300 shown in FIG. 9, or to another module 100 as shown in FIGS. 8 and 9 when the modules are stacked. While a two-layer stack is illustrated, the embodiments are not limited to this. However, when the depth of the enclosure is limited, such as when a front cover wall 300B is provided as shown, there will be a finite limit to stackability due to space constraints. For example, in the example illustrated in FIG. 9, an existing enclosure typically used to house a single row of patch panel modules mounted to the rear wall 300A has a depth of 3.687". Conventional modules used in such an enclosure had a patch panel cable mounting plane parallel to the back wall. Because of bend radius requirements, which limit the minimum bend radius that typical telecommunications cabling mounted parallel to this plane could be bent, such enclosures could only accommodate a single row of modules. However, by the inventive patch panel modules' ability to be stacked, and due to the selection of cable mounting plane CMP angle (relative to the module mounting plane) and module height, two modules 100 may be stacked while still meeting necessary bend radius requirements for patch cabling 200 as shown. In this particular embodiment, the patch panel module side walls have a height of about 1.375" and a front face 102 defining the cable mounting plane CMP for receiving patch panel cabling thereon with an angle (α) of about 35°. Thus, it is possible to maximize the capacity for a given enclosure depth by selection of height and angle that allows stacking, avoids interference, and meets bend radius requirements for the patch panel cabling used.

Thus, in exemplary embodiments, the patch panel 100 may be used individually with an angled cable mounting plane to meet bend radius requirements and space constraints of a narrow depth enclosure, or may be stacked two or more layers high.

It will be appreciated that variations of the above-disclosed and other features and functions, or alternatives thereof, may be desirably combined into many other different systems or applications. For example, while embodiments have been shown and described above for use with electrical connectors, in other embodiments fiber optic connectors may be employed. Also, various presently unforeseen or unanticipated alternatives, modifications, variations or improvements therein may be subsequently made by those skilled in the art, and are also intended to be encompassed by the following claims.

What is claimed is:

1. A patch panel module attachable to a mounting surface on a module mounting plane, the patch panel module comprising:

two opposed side walls, each including a mounting structure for attachment to the mounting surface on the module mounting plane;

a base support panel provided between and interconnecting the two side walls, the base support panel including an electrical component mounting structure;

a patch panel electrical component assembly including a series of patch panel ports, the assembly being fitted to the electrical component assembly mounting structure of the base support panel with the patch panel ports defining a component mounting plane oriented at an angle relative to the module mounting plane; and a cover plate, wherein the electrical component assembly is fitted on the base support panel by the cover plate.

2. The patch panel module according to claim 1, wherein each of the side walls includes a main upstanding wall and two spaced apart laterally extending mounting walls oriented substantially parallel with the module mounting plane, the two laterally extending mounting walls each including the mounting structure to accommodate stacking of a second patch panel module on top of the patch panel module.

3. The patch panel module according to claim 2, wherein the two opposed side walls are C-shaped.

4. The patch panel module according to claim 1, wherein the side walls and base support panel are integrally formed.

5. The patch panel module according to claim 1, wherein the electrical component assembly further comprises a circuit board and is assembled together with compliant pin connections.

6. The patch panel module according to claim 1, wherein pins on the patch panel ports are oriented perpendicular to the printed circuit board.

7. The patch panel module according to claim 1, wherein the angle is acute.

8. The patch panel module according to claim 1, wherein the patch panel is a self-contained, mini patch panel module.

9. The patch panel module according to claim 1, wherein the angle is about 35°.

10. A patch panel module attachable to a mounting surface on a module mounting plane, the patch panel module comprising:

two opposed side walls, each including a mounting structure for attachment to the mounting surface on the module mounting plane;

a base support panel provided between and interconnecting the two side walls, the base support panel including an electrical component mounting structure;

a patch panel electrical component assembly including a series of patch panel ports, the assembly being fitted to the electrical component assembly mounting structure of the base support panel with the patch panel ports defining a component mounting plane oriented at an angle relative to the module mounting plane; and a cover plate, wherein the electrical component assembly is fitted on the base support panel by the cover plate, wherein the cover plate includes a latching system hidden from plain sight once the patch panel module is assembled.

11. The patch panel module according to claim 10, wherein the hidden latching system includes:

toes on the base support panel;

toe holds on the cover plate, the toes respectively corresponding to the toe holds; and at least one latch to attach the cover plate to the base support panel and fit the electrical components to the base support panel.

* * * * *